(12) United States Patent
Kawata et al.

(10) Patent No.: US 11,284,533 B2
(45) Date of Patent: Mar. 22, 2022

(54) COOLING MODULE AND CIRCUIT BOARD

(71) Applicant: Murata Manufacturing Co., Ltd., Nagaokakyo (JP)

(72) Inventors: Shuichi Kawata, Nagaokakyo (JP); Takafumi Moriasa, Nagaokakyo (JP); Masatoshi Kakue, Nagaokakyo (JP); Masahiko Shigaki, Nagaokakyo (JP); Yuichi Kusano, Nagaokakyo (JP); Norihiro Kawahara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 65 days.

(21) Appl. No.: 16/852,594

(22) Filed: Apr. 20, 2020

(65) Prior Publication Data

US 2020/0359526 A1    Nov. 12, 2020

(30) Foreign Application Priority Data

May 10, 2019  (JP) .............................. JP2019-089867

(51) Int. Cl.
| | |
|---|---|
| H05K 7/20 | (2006.01) |
| H05K 1/18 | (2006.01) |
| H05K 1/11 | (2006.01) |
| H05K 1/02 | (2006.01) |
| H01L 23/473 | (2006.01) |

(52) U.S. Cl.
CPC ....... *H05K 7/20218* (2013.01); *H01L 23/473* (2013.01); *H05K 1/0203* (2013.01); *H05K 1/11* (2013.01); *H05K 1/181* (2013.01); *H05K 7/20254* (2013.01); *H05K 7/20272* (2013.01); *H05K 7/20627* (2013.01); *H05K 2201/043* (2013.01)

(58) Field of Classification Search
CPC ........ F04B 19/006; F04B 17/00; F04B 19/00; F04B 37/10; F04B 43/043; F04B 19/20; F28F 2250/08; H05K 1/0203
See application file for complete search history.

(56) References Cited

U.S. PATENT DOCUMENTS

| | | | | |
|---|---|---|---|---|
| 4,612,978 | A * | 9/1986 | Cutchaw | ............... H01L 23/433 165/104.33 |
| 7,316,543 | B2 * | 1/2008 | Goodson | ................. F04B 17/00 204/454 |
| 2004/0120827 | A1 * | 6/2004 | Kim | ...................... H01L 23/473 417/48 |
| 2004/0234378 | A1 * | 11/2004 | Lovette | ................. F28F 19/006 417/48 |
| 2004/0247450 | A1 * | 12/2004 | Kutchinsky | ............. F04B 17/00 417/48 |
| 2005/0034842 | A1 * | 2/2005 | Huber | ....................... C01B 5/00 165/80.4 |

(Continued)

*Primary Examiner* — Adam B Dravininkas
(74) *Attorney, Agent, or Firm* — Keating & Bennett, LLP

(57) ABSTRACT

A cooling module includes an electroosmotic pump. The electroosmotic pump includes a first electrode which is permeable to a cooling fluid, a second electrode which is located with an interval from the first electrode and is permeable to the fluid, and a dielectric layer which is located between the first electrode and the second electrode and includes a microchannel which is permeable to the fluid. The first electrode and the second electrode have different polarities.

20 Claims, 9 Drawing Sheets

(56) References Cited

U.S. PATENT DOCUMENTS

| | | | |
|---|---|---|---|
| 2012/0106083 A1* | 5/2012 | Toftloekke | F28D 15/0266 361/698 |
| 2013/0153425 A1* | 6/2013 | Puleo | F04B 19/006 204/627 |
| 2013/0153797 A1* | 6/2013 | Puleo | F16K 99/0042 251/12 |
| 2013/0156615 A1* | 6/2013 | Puleo | F04B 19/006 417/410.1 |

* cited by examiner

COOLING MODULE AND CIRCUIT BOARD

CROSS REFERENCE TO RELATED APPLICATIONS

This application claims the benefit of priority to Japanese Patent Application No. 2019-089867 filed on May 10, 2019. The entire contents of this application are hereby incorporated herein by reference.

BACKGROUND OF THE INVENTION

1. Field of the Invention

The present invention relates to a cooling module including an electroosmotic pump and a circuit board including the cooling module.

2. Description of the Related Art

U.S. Patent Application Publication No. 2012/0106083 A discloses a liquid cooling system including a plurality of cooling modules, a plurality of heat exchangers, and a plurality of conduits fluidly connected to the plurality of cooling modules and the plurality of heat exchangers. The cooling module is thermally connected to a heat-generating electronic component on a circuit board of the electronic system and cools the electronic component by a coolant flowing in the cooling module.

U.S. Pat. No. 4,612,978 discloses a device for cooling a high-density integrated circuit package. The device described in U.S. Pat. No. 4,612,978 includes a board for inserting an IC package and another IC and a heat exchanger part for covering the board and sealing the IC. The coolant passing through the heat exchanger part carries away the heat associated with the operation of the IC. The heat exchanger part includes a housing having a bottom plate made of a high heat transfer material, a membrane portion including a wire mesh, and a coolant chamber having a contact plate deformable so as to be in contact with the upper surface of the IC. A plurality of heat transfer spheres are filled in the coolant chamber.

In recent years, a cooling module and a circuit board that are able to send a cooling fluid have been demanded.

SUMMARY OF THE INVENTION

A cooling module of a preferred embodiment of the present invention includes an electroosmotic pump. The electroosmotic pump includes a first electrode which is permeable to a cooling fluid, a second electrode which is located with an interval from the first electrode and is permeable to the fluid, and a dielectric layer which is located between the first electrode and the second electrode and includes a microchannel which is permeable to the fluid. The first electrode and the second electrode have different polarities.

A circuit board according to a preferred embodiment of the present invention includes one or more IC boards; one or more IC elements mounted on the one or more IC boards; and one or more cooling modules attached to the IC elements.

Preferred embodiments of the present invention provide cooling modules and circuit boards that are each able to send a cooling fluid.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Background to this Invention

Figure 1:
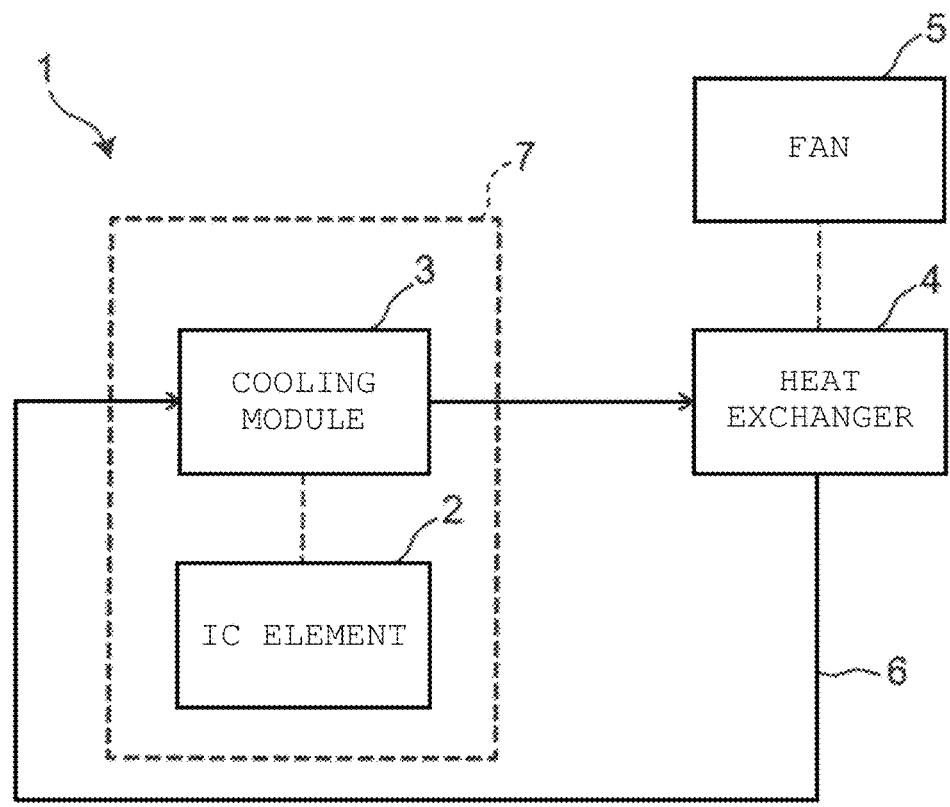
FIG. 1 is a block diagram of one example of a cooling system according to a first preferred embodiment of the present invention.

As a technology for cooling electronic components such as IC elements, for example, a cooling system described in U.S. Patent Application Publication No. 2012/0106083 A and a cooling device described in U.S. Pat. No. 4,612,978 are known. In these systems and devices, a cooling liquid is circulated in a cooling module and a heat exchanger by sending the cooling liquid by a pump. Accordingly, the IC element that physically contacts the cooling module is cooled.

In recent years, in the system and the device including such a cooling module, miniaturization and thinning of the system and the device have been demanded. However, in these system and device, a pump having a liquid supply capacity sufficient to circulate the cooling liquid is provided as a separate component from the cooling module. Therefore, a space to install the pump is required, and there is a problem that it is difficult to reduce the size and thickness of the system and the device.

Therefore, the inventors of preferred embodiments of the present invention have performed intensive studies to find a cooling module including an electroosmotic pump that is able to perform cooling by a fluid and liquid sending, and have developed preferred embodiments of the present invention.

A cooling module of a preferred embodiment of the present invention includes an electroosmotic pump. The electroosmotic pump includes a first electrode which is permeable to a cooling fluid, a second electrode which is located at an interval from the first electrode and is permeable to the fluid, and a dielectric layer which is located between the first electrode and the second electrode and includes a microchannel which is permeable to the fluid. The first electrode and the second electrode have different polarities.

Accordingly, the cooling module is able to send the cooling fluid.

In the cooling module, the dielectric layer may include a plurality of spheres, and the microchannel may be a void provided between the plurality of spheres.

Accordingly, a microchannel having a dimension in which an electroosmotic flow occurs is able to be easily provided.

The cooling module further may include an exterior body including the electroosmotic pump. The exterior body may include a housing including an opening and a lid which closes the opening of the housing. The housing may include a first side wall, a second side wall facing the first side wall, and a connection portion which faces the lid and connects the first side wall and the second side wall. The first electrode, the second electrode and the dielectric layer may be stacked and provided in a direction from the first side wall toward the second side wall of the housing. On a first side wall of the housing positioned on the first electrode side, an inlet through which the fluid flows may be provided in a direction in which the first electrode, the second electrode, and the dielectric layers are stacked. On a second side wall of the housing positioned on the second electrode side, an outlet through which the fluid flows may be provided in the direction in which the first electrode, the second electrode, and the dielectric layers are stacked.

Accordingly, the fluid is able to be easily sent by the electroosmotic flow.

In the cooling module, the connection portion may be provided with a first electrode terminal electrically connected to the first electrode and a second electrode terminal electrically connected to the second electrode.

Accordingly, the first electrode and the second electrode are able to be easily electrically connected to the power supply with the first electrode terminal and the second electrode terminal provided therebetween.

In the cooling module, the first electrode and the second electrode may face each other with the dielectric layer interposed therebetween.

Accordingly, the fluid is able to be more easily sent by the electroosmotic flow.

In the cooling module, the lid may have a plurality of recesses on a surface that contact the dielectric layer, and the plurality of recesses may have a shape along the shape of the dielectric layer.

Accordingly, the cooling performance of the cooling module is able to be significantly improved.

In the cooling module, the dielectric layer may define a first dielectric layer. The electroosmotic pump further may include a third electrode which is located at an interval from the second electrode and is permeable to the fluid, a fourth electrode which is located at an interval from the third electrode and is permeable to the fluid, a second dielectric layer which is located between the second electrode and the third electrode and includes a microchannel, and a third dielectric layer which is located between the third electrode and the fourth electrode and includes a microchannel. Polarities of the first electrode and the third electrode may be different from polarities of the second electrode and the fourth electrode.

Accordingly, the flow rate of the fluid to be sent is able to be increased.

In the cooling module, the thickness of the first dielectric layer and the thickness of the third dielectric layer may be smaller than a thickness of the second dielectric layer.

Accordingly, the flow rate of the fluid to be sent is able to be further increased.

A according to a preferred embodiment of the present invention circuit board includes one or more IC boards; one or more IC elements mounted on the one or more IC boards; and one or more cooling modules attached to the IC elements.

Accordingly, the circuit board including the cooling module is able to send the cooling fluid.

The circuit board further may include one or more heat spreaders which are located between the one or more IC elements and the one or more cooling modules; and a motherboard on which the one or more IC boards and the one or more heat spreaders are mounted.

Accordingly, the cooling performance of the cooling module is able to be further significantly improved.

In the circuit board, the motherboard may include a power supply including an input terminal and an output terminal, the input terminal of the power supply may be electrically connected to a first electrode terminal of the one or more cooling modules, and the output terminal of the power supply may be electrically connected to a second electrode terminal of the one or more cooling modules.

Accordingly, the cooling module is able to be driven by the power supply of the motherboard.

In the circuit board, the one or more cooling modules may be provided on the one or more heat spreaders, and a portion of the one or more cooling modules that is not in contact with the one or more heat spreaders may be attached to the motherboard.

Accordingly, the cooling module is able to be attached to the motherboard while the cooling module is in contact with the heat spreader.

The circuit board further may include: a pipe which connects the plurality of cooling modules in parallel.

Accordingly, the flow rate of the fluid is able to be increased, and the cooling performance may be significantly improved.

Hereinafter, preferred embodiments of the present invention will be described with reference to the accompanying drawings. In the following description, terms indicating a specific direction or position (for example, terms including "up", "down", "right", "left") will be used. The terms are used to facilitate understanding of the present disclosure with reference to the drawings, and the technical scope of the present disclosure is not limited by the meaning of those terms. Further, the following description is merely an example in nature, and is not intended to limit the present disclosure, the application thereof, or the use thereof. Furthermore, the drawings are schematic, and the ratios of the dimensions do not necessarily match actual ones.

First Preferred Embodiment

Overall Structure

Figure 2:
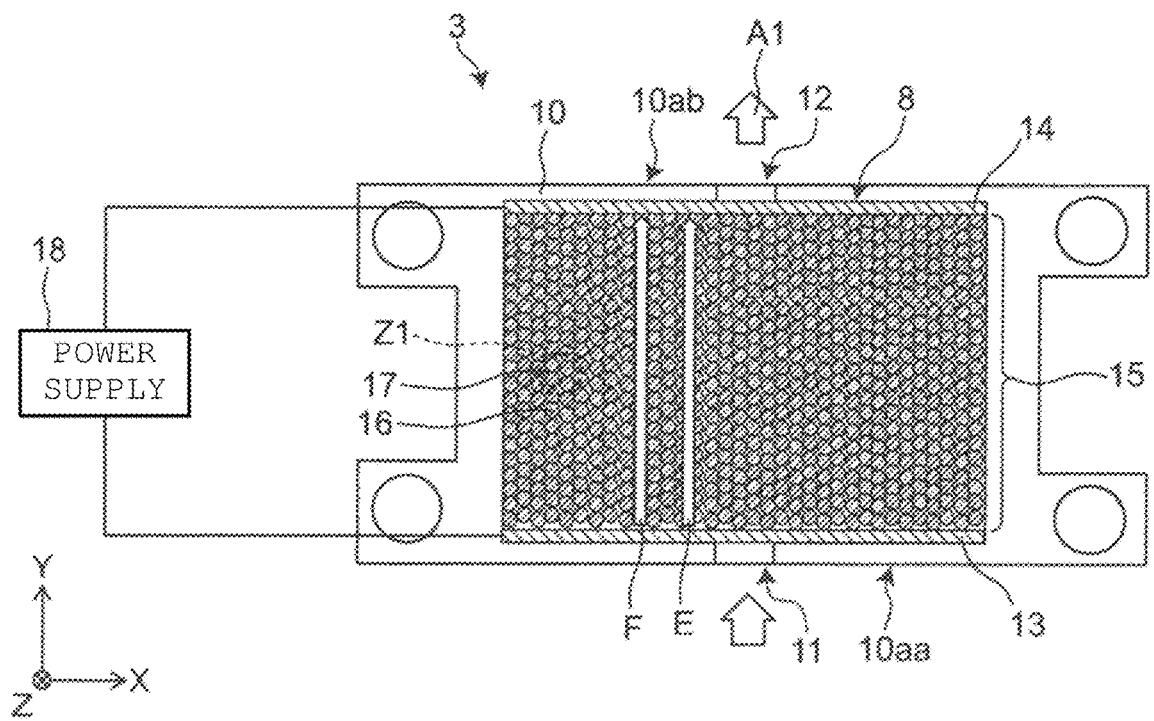
FIG. 2 is a diagram of one example of a cooling module according to the first preferred embodiment of the present invention in plan view.
Figure 3:
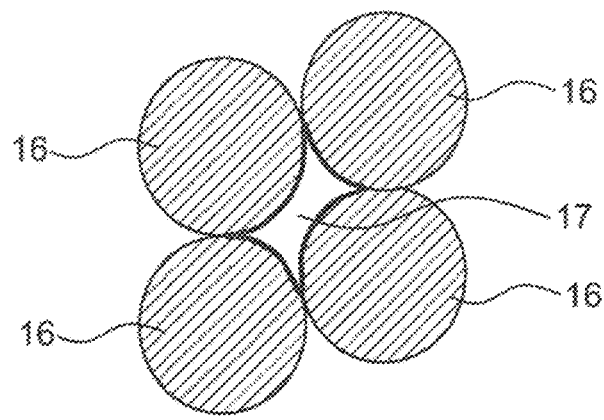
FIG. 3 is an enlarged view of a Z1 portion in FIG. 2.
Figure 4:
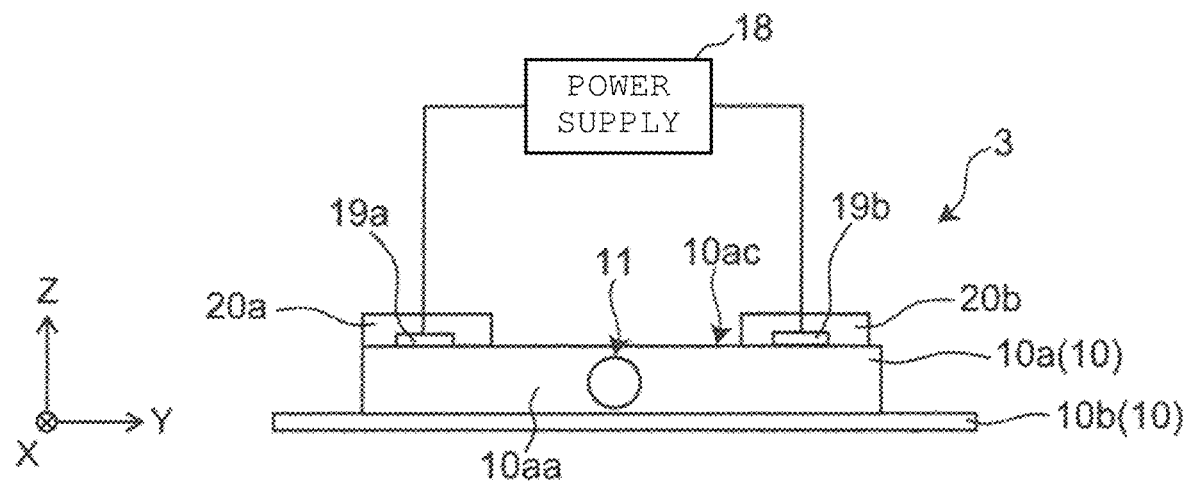
FIG. 4 is a diagram of one example of the cooling module according to the first preferred embodiment of the present invention in front view.
Figure 5:
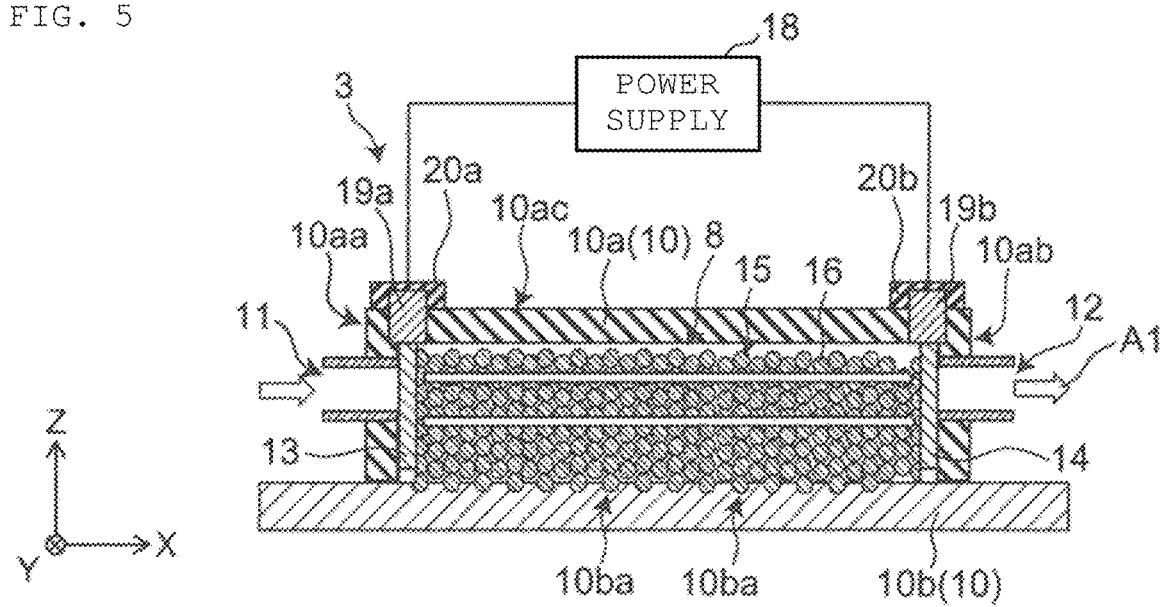
FIG. 5 is a cross-sectional view of one example of the cooling module according to the first preferred embodiment of the present invention in side view.

FIG. 1 is a block diagram of one example of a cooling system 1 according to a first preferred embodiment of the present invention. FIG. 2 is a diagram of one example of a cooling module according to the first preferred embodiment of the present invention in plan view. FIG. 3 is an enlarged view of a Z1 portion in FIG. 2. FIG. 4 is a diagram of one example of the cooling module 3 according to the first preferred embodiment of the present invention in front view. FIG. 5 is a cross-sectional view of one example of the cooling module 3 according to the first preferred embodiment of the present invention in side view. The X, Y, and Z directions in the drawings indicate the horizontal direction, the vertical direction, and the thickness direction of the cooling module 3, respectively.

As shown in FIG. 1, the cooling system 1 includes an IC element 2, the cooling module 3, a heat exchanger 4, a fan 5, and a pipe 6. In the first preferred embodiment, the IC element 2 and the cooling module 3 are components of a circuit board 7. The cooling module 3 and the heat exchanger 4 are connected by the pipe 6. The pipe 6 is connected to the cooling module 3 and the heat exchanger 4, and circulates a cooling fluid between the cooling module 3 and the heat exchanger 4.

Pure water, methanol, ethanol, isopropyl alcohol (IPA), propanol, butanol, fluorocarbon liquid, fluorine liquid, tris borate (TBE) buffer, borate buffer, phosphate buffer, or the like, for example, can be used as the fluid. When the fluid is pure water, for example, the electrolyte concentration is preferably low.

IC Element

The IC element 2 is an element mounted on a board. For example, the IC element 2 is an electronic component including a processing circuit and the like. The IC element 2 is an object to be cooled by the cooling module 3. For example, the IC element 2 may be a central processing unit (CPU) or a graphics processing unit (GPU).

Cooling Module

The cooling module 3 physically contacts the IC element 2 and cools the IC element 2. Fluid is supplied to the cooling module 3 through the pipe 6. The cooling module 3 cools the IC element 2 with the fluid supplied from the pipe 6. Specifically, the heat generated in the IC element 2 moves to the fluid flowing through the cooling module 3, so that the IC element 2 is cooled.

As shown in FIGS. 2 and 5, the cooling module 3 includes an electroosmotic pump 8 and an exterior body 10. The electroosmotic pump 8 is included in the exterior body 10.

The exterior body 10 includes a housing 10a including an opening and a lid 10b that closes the opening of the housing 10a. The housing 10a includes a first side wall 10aa, a second side wall 10ab facing the first side wall 10aa, and a connection portion 10ac that faces the lid 10b and connects the first side wall 10aa and the second side wall 10ab. The first side wall 10aa, the second side wall 10ab, and the connection portion 10ac have plate shapes. Further, the exterior body 10 includes an inlet 11 through which the fluid flows in and an outlet 12 through which the fluid flows out. Specifically, the inlet 11 is provided on the first side wall 10aa of the housing 10a. The outlet 12 is provided on the second side wall 10ab of the housing 10a. In the first preferred embodiment, the direction from the inlet 11 to the outlet 12 is a fluid flow direction A1. Thus, in the cooling module 3, the fluid flows in from the inlet 11, passes through the inside of the exterior body 10, and is discharged through the outlet 12.

The exterior body 10 is made of an insulating material. Examples of the insulating material include ceramics.

As shown in FIGS. 4 and 5, the connection portion 10ac is provided with a first electrode terminal portion 19a and a second electrode terminal portion 19b. The connection portion 10ac has a flat or substantially flat plate shape extending along the XY plane. One end of the connection portion 10ac in the X direction is connected to the first side wall 10aa extending in the Z direction. The other end of the connection portion 10ac in the X direction is connected to the second side wall 10ab extending in the Z direction. The first electrode terminal portion 19a and the second electrode terminal portion 19b are made of a conductive material. The first electrode terminal portion 19a and the second electrode terminal portion 19b are covered with insulators 20a and 20b, respectively.

The electroosmotic pump 8 is located inside the exterior body 10 defined by the housing 10a and the lid 10b. The electroosmotic pump 8 includes a first electrode 13, a second electrode 14 located at an interval from the first electrode 13, and a dielectric layer 15 located between the first electrode 13 and the second electrode 14. The first electrode 13, the second electrode 14, and the dielectric layer 15 are stacked inside the housing 10a. Specifically, the first electrode 13, the second electrode 14, and the dielectric layer 15 are stacked and provided in a direction from the first side wall 10aa toward the second side wall 10ab of the housing 10a. In the first preferred embodiment, the electroosmotic pump 8 is provided by stacking the first electrode 13, the dielectric layer 15, and the second electrode 14 in this order along the flow direction A1 inside the housing 10a. Further, the first electrode 13 and the second electrode 14 face each other with the dielectric layer 15 interposed therebetween.

The inlet 11 of the housing 10a is provided in the direction (Y direction) in which the first electrode 13, the second electrode 14, and the dielectric layer 15 are stacked on the first side wall 10aa of the housing 10a positioned on the first electrode 13 side. The outlet 12 of the housing 10a is provided in the direction (Y direction) in which the first electrode 13, the second electrode 14, and the dielectric layer 15 are stacked on the second side wall 10ab of the housing 10a positioned on the second electrode 14 side. In other words, the inlet 11 and the outlet 12 of the housing 10a are provided along the fluid flow direction A1.

The first electrode 13 and the second electrode 14 are made of a material which is permeable to a fluid. The first electrode 13 and the second electrode 14 are preferably made of, for example, a porous conductive material having a thickness of about 1 μm. As the porous conductive material, a metal material, for example, Pt, Cu, Ag, Au, and Ni may be used. In the first preferred embodiment, the first electrode 13 and the second electrode 14 preferably made of a flat or substantially flat metal mesh having two opposing main surfaces.

The first electrode 13 and the second electrode 14 face each other with an interval therebetween. Specifically, the first electrode 13 and the second electrode 14 face each other with an interval in the flow direction A of the fluid. The main surfaces of the first electrode 13 and the second electrode 14 are provided in a direction intersecting with the fluid flow direction A1.

The first electrode 13 is located on the upstream side of the second electrode 14. Specifically, the first electrode 13 is located on a side adjacent to or in a vicinity of to the inlet 11. The second electrode 14 is located on the side adjacent to or in a vicinity of the outlet 12. In the first preferred embodiment, the first electrode 13 is located adjacent to or in a vicinity of the first side wall 10aa. The second electrode 14 is located adjacent to or in a vicinity of the second side wall 10ab.

The dielectric layer 15 is made of a dielectric provided with a plurality of microchannels 17. The microchannel 17 is a flow path provided in the dielectric and through which a fluid is able to flow. The dielectric is preferably made of, for example, porous ceramics. As the porous ceramics, $SiO_2$, $Al_2O_3$, $ZrO_2$, $TiO_2$, $BaTiO_3$ and the like, for example, may be used.

In the first preferred embodiment, the dielectric layer 15 includes a plurality of spheres 16. The dielectric layer 15 is formed by providing a plurality of spheres 16 between the first electrode 13 and the second electrode 14. Specifically, the dielectric layer 15 is formed by filling the space between the first electrode 13 and the second electrode 14 with the plurality of spheres 16 inside the exterior body 10.

In the first preferred embodiment, as shown in FIG. 3, the microchannel 17 is a void defined between the plurality of spheres 16. Specifically, the microchannel 17 is a void defined by portions of the adjacent spheres 16 that do not contact each other. The microchannel 17 is designed with dimensions to provide electroosmotic flow.

The plurality of spheres 16 may be made of, for example, ceramics or a metal coated with ceramics. The dimensions of the plurality of spheres 16 are preferably, for example, about 0.1 μm or more and about 50 μm or less in diameter. Preferably, for example, the dimensions of the plurality of spheres 16 are about 1 μm or more and about 20 μm or less in diameter.

As shown in FIGS. 2, 4, and 5, the first electrode 13 is electrically connected to an input terminal of a DC or AC power supply 18. The second electrode 14 is electrically connected to an output terminal of the power supply 18. Specifically, the first electrode 13 is electrically connected to the input terminal of the power supply 18 with the first electrode terminal 19a provided on the connection portion 10ac of the housing 10a interposed therebetween. The second electrode 14 is electrically connected to the output terminal of the power supply 18 with the second electrode terminal 19b provided at the connection portion 10ac of the housing 10a interposed therebetween. As described above, the first electrode 13 and the second electrode 14 have mutually different polarities. In the first preferred embodiment, the first electrode 13 defines and functions as an anode, and the second electrode 14 defines and functions as a cathode.

As shown in FIG. 5, the lid 10b includes a plurality of recesses 10ba on the surface in contact with the dielectric layer 15. The plurality of recesses 10ba have a shape along the shape of the dielectric layer 15. Specifically, each of the plurality of recesses 10ba preferably has a hemispherical or substantially hemispherical shape, for example, having a dimension that accommodates at least a portion of the plurality of spheres 16. The plurality of recesses 10ba are provided on the lid 10b between the first electrode 13 and the second electrode 14 where the dielectric layer 15 is provided.

When the cooling module 3 is attached to the IC element 2 or the like to be cooled, the lid 10b is pressed to the dielectric layer 15 by the IC element 2 or the heat spreader attached to the IC element 2. Thus, at least a portion of the plurality of spheres 16 that come into contact with the lid 10b are provided in the plurality of recesses 10ba. As a result, the contact area between the lid 10b and the dielectric layer 15 is able to be increased. By increasing the contact area between the lid 10b and the dielectric layer 15, the thermal conductivity is able to be significantly improved. Since the IC element 2 to be cooled is in contact with the lid 10b, the cooling effect is able to be significantly improved by increasing the contact area between the lid 10b and the dielectric layer 15.

The lid 10b is formed of a metal material. Examples of the metal material include Al and Cu.

Heat Exchanger

The heat exchanger 4 cools the fluid flowing from the cooling module 3 through the pipe 6. Specifically, the heat exchanger 4 exchanges heat between the cooling air supplied from the fan 5 and the fluid flowing from the cooling module 3. Thus, the heat exchanger 4 cools the fluid heated by the cooling module 3 by the cooling air supplied from the fan 5 and returns the fluid to the cooling module 3 again through the pipe 6.

Motion

Next, the operation of the cooling module 3 will be described with reference to FIGS. 2 and 5. In FIGS. 2 and 5, it is assumed that a fluid exists inside the cooling module 3.

As shown in FIGS. 2 and 5, a voltage is applied between the first electrode 13 and the second electrode 14 by the power supply 18 in a state where the fluid exists inside the cooling module 3. As a result, an electric field E is generated from the first electrode 13 toward the second electrode 14. That is, an electric field E is generated between the first electrode 13 and the second electrode 14 in the fluid flow direction A1 from the inlet 11 to the outlet 12.

When the electric field E is generated between the first electrode 13 and the second electrode 14, a driving force F is generated in the fluid existing in the microchannel 17 provided inside the dielectric layer 15. The direction of the driving force F is determined by the combination of the material of the dielectric layer 15 and the components of the fluid. For example, when the fluid is water, and the dielectric layer is $SiO_2$, the driving force F is generated in the same direction as the electric field E. As a result, the liquid existing in the microchannel 17 provided inside the dielectric layer 15 flows in the flow direction A1. Note that the magnitude of the driving force F is proportional to the intensity of the electric field E generated between the first electrode 13 and the second electrode 14, and the magnitude of the electric field E is inversely proportional to the thickness of the dielectric layer 15.

The flow rate Q of the pump using the electroosmotic flow is calculated by, for example, the following Equation 1.

$$Q = -\frac{\psi A}{\mu L \tau}\left(\varepsilon \zeta V\left(1 - \frac{2\lambda I_1(\alpha/\lambda)}{\alpha I_0(\alpha/\lambda)}\right) - \frac{\Delta P \alpha^2}{8}\right) \quad \text{Equation 1}$$

In the above Equation 1, A is an area [m²] of the cross section perpendicular or substantially perpendicular to the flow direction of the dielectric, L is a thickness [m] of the dielectric, $\Psi$ is a porosity of the porous dielectric, and $\tau$ is a bending degree of the porous dielectric, $\alpha$ is an average pore diameter [m] of the porous dielectric, $\varepsilon$ is a dielectric constant [C/V·m] of the solution, $\mu$ is a viscosity [Pa·s] of the solution, $\zeta$ is a zeta potential [V], $\lambda$ is a Debye length [m], $I_1$ is a first-order modified Bessel function, $I_0$ is a zero-order modified Bessel function, $\Delta P$ is a pressure gradient [Pa], and V is an applied voltage [V].

That is, the flow rate of the electroosmotic pump 8 and the intensity (=V/L) of the electric field E generated between the first electrode 13 and the second electrode 14 have a linear relationship.

Thus, in the cooling module 3, the fluid is moved by the electroosmotic flow, so that the fluid is circulated between the cooling module 3 and the heat exchanger 4 through the pipe 6. That is, the cooling module 3 has a function of cooling the IC element 2 and also has a function as a pump that generates a driving force to circulate the fluid.

Circuit Board

Figure 6:
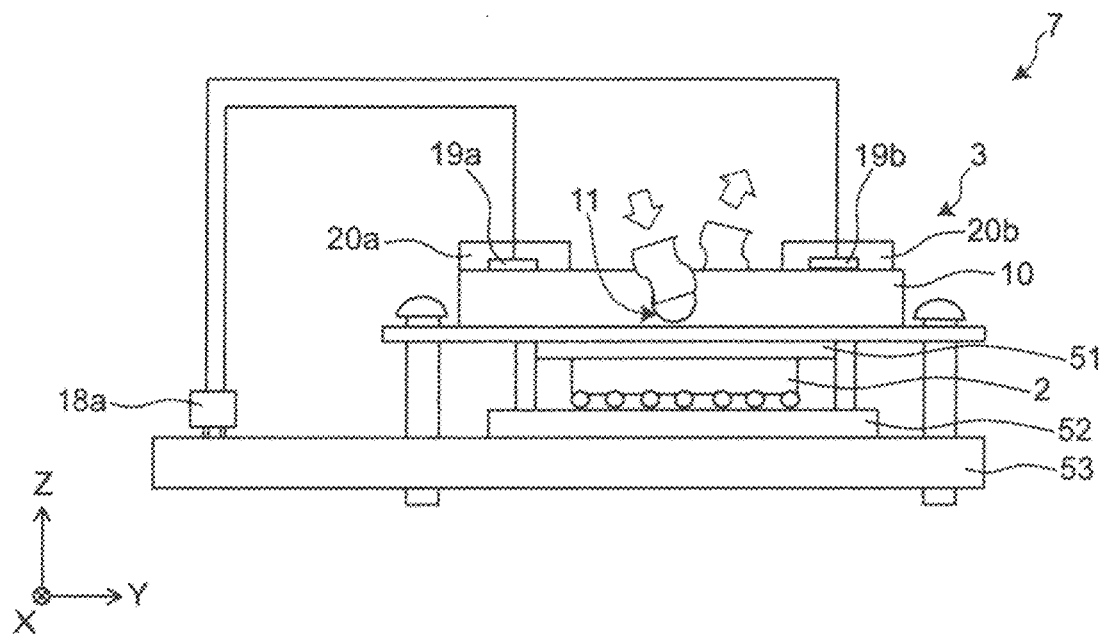
FIG. 6 is a view of one example of a circuit board according to the first preferred embodiment of the present invention.

Next, an example of the circuit board 7 including the cooling module 3 will be described with reference to FIG. 6. FIG. 6 is a view of one example of the circuit board 7 according to the first preferred embodiment of the present invention.

As shown in FIG. 6, the circuit board 7 includes the IC element 2, the cooling module 3, a heat spreader 51, an IC board 52, and a motherboard 53.

The heat spreader 51 is located between the IC element 2 and the cooling module 3. The heat spreader 51 is preferably made of a metal material, for example, Cu or Al. The heat spreader 51 efficiently conducts the heat generated in the IC element 2 to the cooling module 3.

The IC board 52 is a board on which the IC element 2 is mounted. For example, an IC package including the IC element 2 is mounted.

The motherboard 53 is a board for an electronic circuit in which a CPU, a memory, and the like are incorporated. In the first preferred embodiment, the IC board 52 and the power supply 18a are mounted on the motherboard 53.

The power supply 18a is mounted on the motherboard 53, and the power supply voltage is DC 12V. The input terminal of the power supply 18a is electrically connected to the first electrode terminal 19a of the cooling module 3. The output terminal of the power supply 18a is electrically connected to the second electrode terminal 19b of the cooling module 3. Thus, the first electrode 13 provided in the cooling module 3 is electrically connected to the input terminal of the power supply 18a with the first electrode terminal 19a provided therebetween. The second electrode 14 is electrically connected to the output terminal of the power supply 18a with the second electrode terminal 19b provided therebetween.

The cooling module 3 is provided on the heat spreader 51 and is attached to the motherboard 53 by, for example, screws. For example, a portion of the cooling module 3 that is not in contact with the heat spreader 51 is attached to the motherboard 53 with screws or the like. Specifically, the outer shape of the lid 10b in the cooling module 3 is larger than the upper surface of the heat spreader 51 on which the cooling module 3 is provided. Accordingly, the outer edge of the lid 10b is a portion that does not contact the heat spreader 51. The heat generated in the IC element 2 is conducted to the cooling module 3 with the heat spreader 51 provided therebetween. Thereby, the cooling module 3 cools the IC element 2.

Note that the cooling module 3 is not limited to being attached by screws, and may be attached on the motherboard 53 by various methods.

Manufacturing Method of Cooling Module

A non-limiting example of a method for manufacturing the cooling module 3 will be described with reference to FIGS. 7A to 7F. FIGS. 7A to 7F are views showing an example of a manufacturing process of the cooling module 3 according to the first preferred embodiment of the present invention.

Figure 7A:
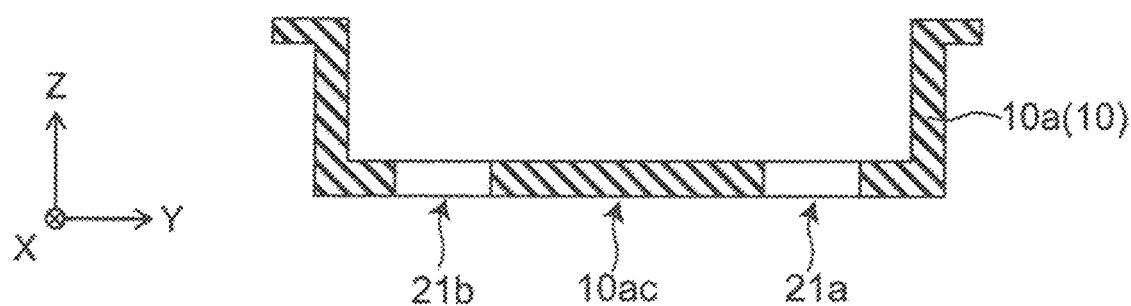
FIG. 7A is a view showing one example of a manufacturing process of the cooling module according to the first preferred embodiment of the present invention.

As shown in FIG. 7A, the housing 10a is prepared. Specifically, the housing 10a is provided with the connection portion 10ac of the housing 10a on the lower side and the opening of the housing 10a on the upper side. The connection portion 10ac of the housing 10a is provided with through holes 21a and 21b that communicate the inside and the outside of the housing 10a.

Figure 7B:
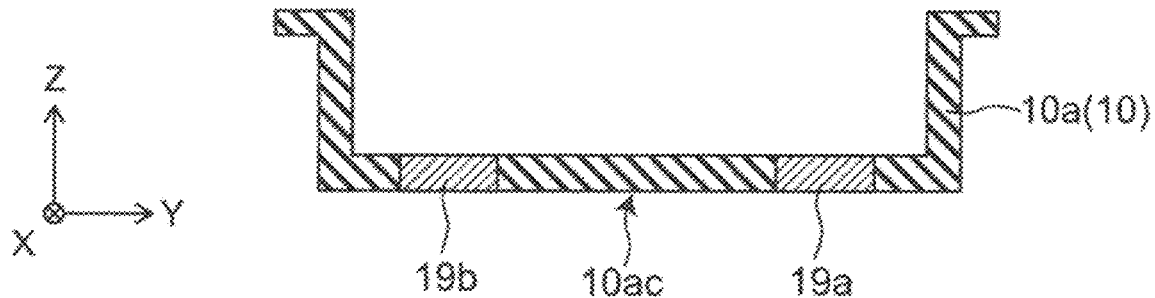
FIG. 7B is a view showing one example of the manufacturing process of the cooling module according to the first preferred embodiment of the present invention.

As shown in FIG. 7B, the first electrode terminal portion 19a and the second electrode terminal portion 19b are formed on the housing 10a. For example, the first electrode terminal portion 19a and the second electrode terminal portion 19b are formed by inserting a conductive material into the through holes 21a and 21b provided in the connection portion 10ac of the housing 10a, respectively.

Figure 7C:
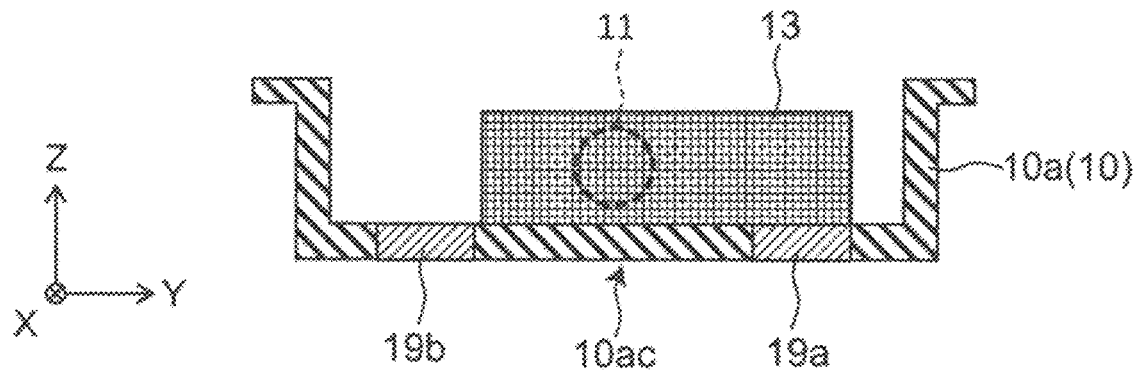
FIG. 7C is a view showing one example of the manufacturing process of the cooling module according to the first preferred embodiment of the present invention.

As shown in FIG. 7C, the first electrode 13 is located inside the housing 10a. Specifically, the first electrode 13 is located on the side near the inlet 11, that is, adjacent to or in a vicinity of the first side wall 10aa (see FIGS. 2 and 5) inside the housing 10a. The main surface of the first electrode 13 is provided in a direction intersecting the direction from the inlet 11 to the outlet 12 (flow direction A1). The first electrode 13 is electrically connected to the first electrode terminal 19a.

Figure 7D:
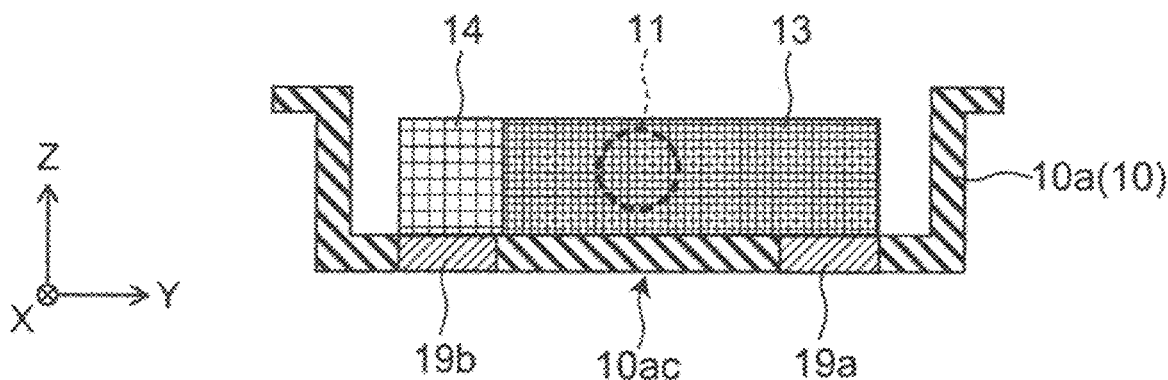
FIG. 7D is a view showing one example of the manufacturing process of the cooling module according to the first preferred embodiment of the present invention.

As shown in FIG. 7D, the second electrode 14 is located with an interval from the first electrode 13 inside the housing 10a. Specifically, the second electrode 14 is located on the side close to the outlet 12, that is, adjacent to or in a vicinity of the second side wall 10ab (see FIGS. 2 and 5) inside the housing 10a. The second electrode 14 faces the first electrode 13 with an interval. The second electrode 14 is electrically connected to the second electrode terminal 19b.

Note that the length of the first electrode 13 and the second electrode 14 in the height direction (Z direction) is smaller than the height of the housing 10a. Thus, when the lid 10b is attached, the first electrode 13 and the second electrode 14 do not contact the lid 10b, so that the insulation of the lid 10b is ensured.

Figure 7E:
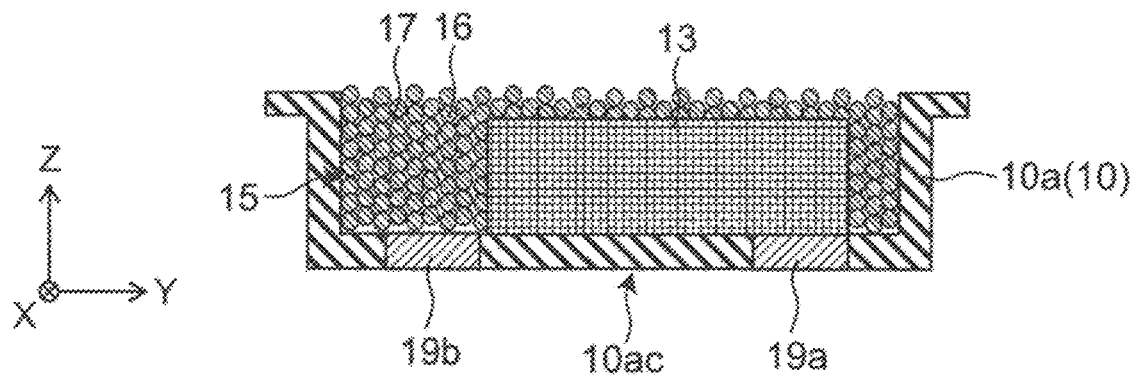
FIG. 7E is a view showing one example of the manufacturing process of the cooling module according to the first preferred embodiment of the present invention.

As shown in FIG. 7E, the dielectric layer 15 is formed between the first electrode 13 and the second electrode 14 inside the housing 10a. Specifically, the plurality of spheres 16 are provided between the first electrode 13 and the second electrode 14 inside the housing 10a. More specifically, inside the housing 10a, the space between the first electrode 13 and the second electrode 14 is filled with the plurality of spheres 16. As a result, the dielectric layer 15 formed by the plurality of spheres is formed between the first electrode 13 and the second electrode 14. The plurality of voids formed between the plurality of spheres 16 define and function as the plurality of microchannels 17.

The dielectric layer 15 is formed in contact with the first electrode 13 and the second electrode 14. Accordingly, inside the housing 10a, the first electrode 13, the dielectric layer 15, and the second electrode 14 are stacked in this order when viewed from the upstream side where the fluid flows.

Figure 7F:
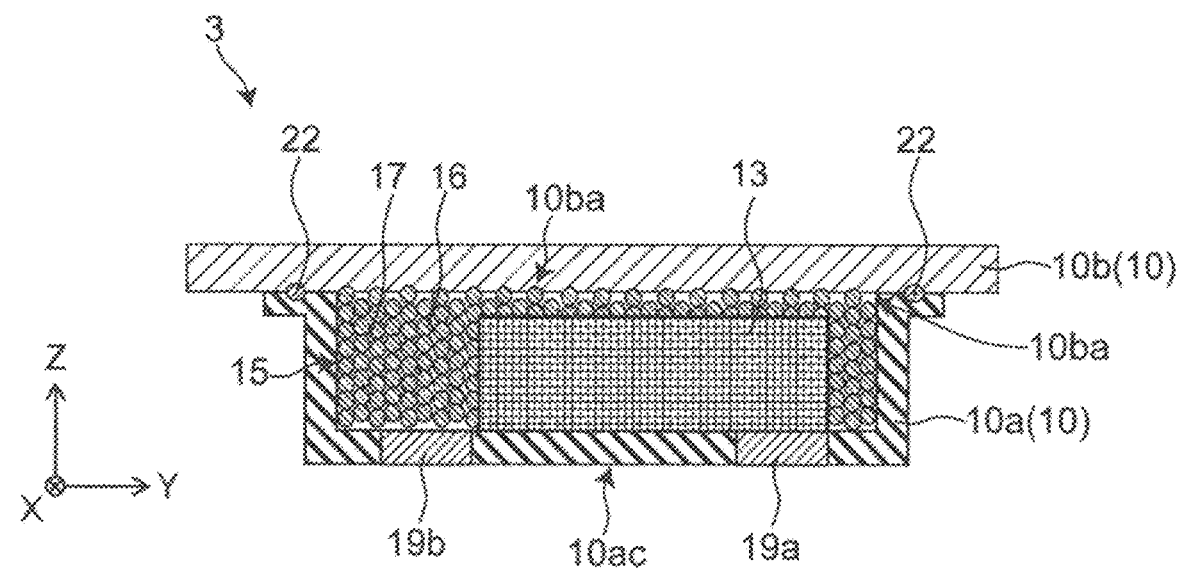
FIG. 7F is a view showing one example of the manufacturing process of the cooling module according to the first preferred embodiment of the present invention.

As shown in FIG. 7F, the lid 10b is attached to the housing 10a. Specifically, the lid 10b is attached to the housing 10a adjacent to or in a vicinity of the opening of the housing 10a. At this time, a seal member 22 is provided between the housing 10a and the lid 10b. Thus, leakage of fluid from a gap between the housing 10a and the lid 10b is able to be significantly reduced or prevented.

The lid 10b includes the plurality of recesses 10ba on a surface that contacts the dielectric layer 15 when the lid 10b is attached to the housing 10a. The plurality of recesses 10ba have a shape along the shape of the dielectric layer 15. Here, when the IC element 2 or the like to be cooled is in contact with the lid 10b, the lid 10b presses the dielectric layer 15. At this time, since at least a portion of the dielectric layer 15 is provided in the plurality of recesses 10ba, the contact area between the dielectric layer 15 and the lid 10b increases. Thus, the thermal conductivity between the cooling module 3 and the IC element 2 is able to be significantly improved.

Finally, the input terminal of the power supply 18 is electrically connected to the first electrode terminal 19a, and the output terminal of the power supply 18 is electrically connected to the second electrode terminal 19b. After that, the first electrode terminal portion 19a and the second electrode terminal portion 19b are covered with the first insulator 20a and the second insulator 20b, respectively.

Thus, the cooling module 3 is able to be manufactured.

Method of Manufacturing Electrode

Figure 8A:
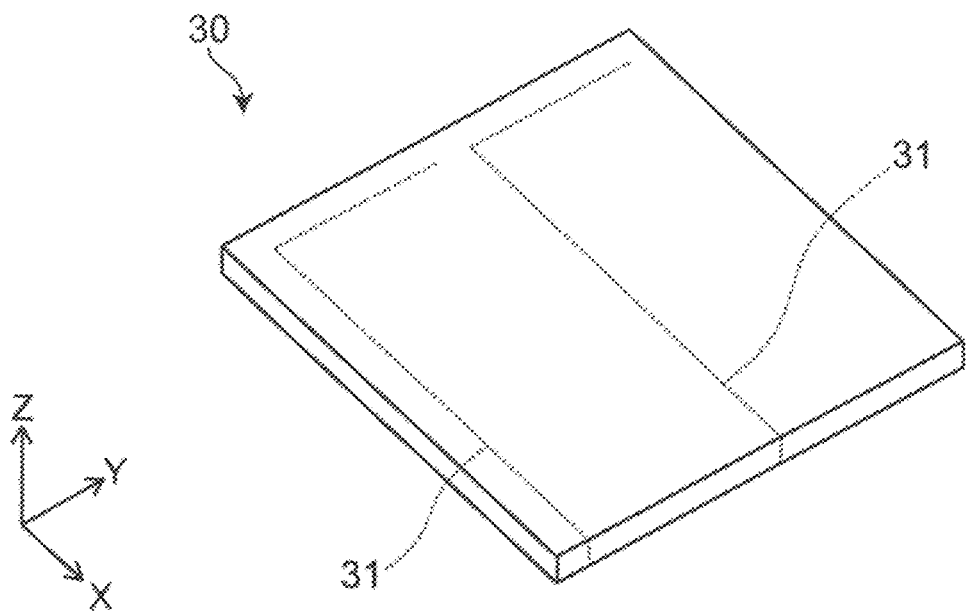
FIG. 8A is a view showing one example of a manufacturing process of a first electrode and a second electrode.
Figure 8B:
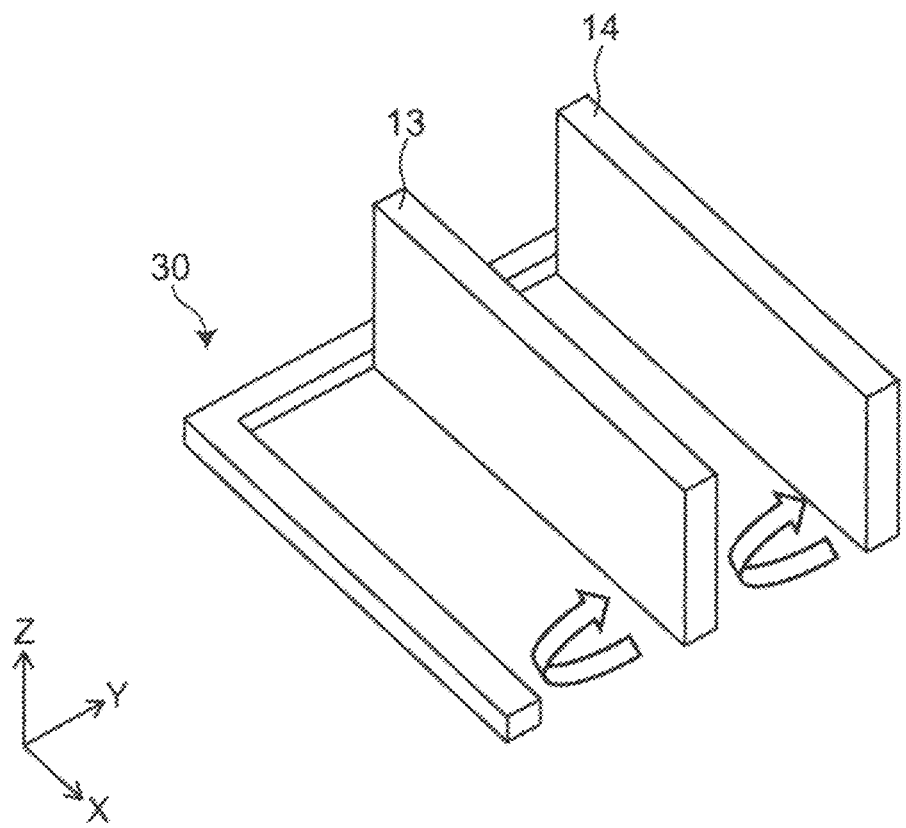
FIG. 8B is a view showing one example of the manufacturing process of the first electrode and the second electrode.

A non-limiting example of a method for manufacturing an electrode will be described with reference to FIGS. 8A and 8B. FIGS. 8A and 8B are views showing one example of a manufacturing process of the first electrode and the second electrode.

As shown in FIG. 8A, a flat porous body 30 is prepared. For example, the porous body 30 is a rectangular or substantially rectangular metal mesh. The porous body 30 is cut along two L-shaped cut lines 31. The two cut lines 31 are formed with an interval therebetween.

As shown in FIG. 8B, a portion cut toward the thickness direction (Z direction) of the porous body 30 is raised. Thus, the first electrode 13 and the second electrode 14 are able to be manufactured.

According to the manufacturing method, the first electrode 13 and the second electrode 14 are able to be manufactured with the relatively thin flat porous body 30. Accordingly, the thicknesses of the first electrode 13 and the second electrode 14 are able to be significantly reduced.

Advantageous Effects

According to the cooling module 3 according to the first preferred embodiment, the following advantageous effects are able to be provided.

The cooling module 3 includes an electroosmotic pump 8. The electroosmotic pump 8 includes the first electrode 13 which is permeable to a cooling fluid, the second electrode 14 which faces the first electrode 13 and is permeable to a fluid, and the dielectric layer 15 which is located between the first electrode 13 and the second electrode 14 and includes the microchannel 17 which is permeable to a fluid. The first electrode 13 and the second electrode 14 have mutually different polarities. Accordingly, the cooling module 3 that sends a cooling fluid by an electroosmotic flow is able to be provided. Thus, the cooling module 3 is able to circulate the fluid while cooling the object to be cooled by the fluid.

Since the fluid is able to be circulated by the cooling module 3, a pump that sends the fluid is able to be omitted. Thus, according to the cooling module 3, a space to install the pump is able to be eliminated. Thus, the cooling system 1 and the device is able to be significantly reduced in size and thickness.

In addition, the cooling module 3 is able to increase the pump pressure and decrease the flow rate by sending the fluid by the electroosmotic flow. Thus, the diameter of the pipe 6 through which the fluid flows is able to be significantly reduced. That is, the pressure of the electroosmotic pump is able to be larger than the pressure loss caused by reducing the diameter of the pipe 6. As a result, for example, it is easy to route the pipe 6 to a narrow space between electronic components or a small space between the housing and the board.

The dielectric layer 15 includes the plurality of spheres 16, and the microchannel 17 is a void defined between the plurality of spheres 16. Accordingly, the dielectric layer 15 including the microchannel 17 is able to be easily provided.

The cooling module 3 includes the housing 10a including an opening, and the lid 10b that closes the opening of the housing 10a. The housing 10a includes a first side wall 10aa, a second side wall 10ab facing the first side wall 10aa, and a connection portion 10ac that faces the lid 10b and connects the first side wall 10aa and the second side wall 10ab. The first electrode 13, the second electrode 14, and the dielectric layer 15 are stacked and provided in a direction from the first side wall 10aa toward the second side wall 10ab of the housing 10a. The first side wall 10aa of the housing 10a positioned on the first electrode 13 side is provided with the inlet 11 through which a fluid flows in a direction in which the first electrode 13, the second electrode 14, and the dielectric layer 15 are stacked. The second side wall 10ab of the housing 10a positioned on the second electrode 14 side is provided with the outlet 12 through which a fluid flows out in a direction in which the first electrode 13, the second electrode 14, and the dielectric layer 15 are stacked. Thus, the fluid flowing from the inlet 11 passes through the first electrode 13, the dielectric layer 15, and the second electrode 14, and is discharged through the outlet 12. Accordingly, the fluid is able to be easily sent by the electroosmotic flow.

The connection portion 10ac is provided with the first electrode terminal 19a electrically connected to the first electrode 13 and the second electrode terminal 19b electrically connected to the second electrode 14. Accordingly, the first electrode 13 and the second electrode 14 are able to be easily electrically connected to the power supply 18 with the first electrode terminal 19a and the second electrode terminal 19b provided therebetween.

The first electrode 13 and the second electrode 14 face each other with the dielectric layer 15 provided therebetween. Accordingly, the fluid is able to be more easily sent by the electroosmotic flow.

The lid 10b includes the plurality of recesses 10ba on a surface that contacts the dielectric layer 15, and the plurality of recesses 10ba have a shape along the shape of the dielectric layer 15. Thus, the contact area between the dielectric layer 15 and the lid 10b is able to be increased, and the thermal conductivity between the dielectric layer 15 and the lid 10b is able to be significantly improved. Accordingly, the cooling performance of the cooling module 3 is able to be significantly improved.

Further, the circuit board 7 including the cooling module 3 has the same or similar advantageous effects as those described above. For example, the circuit board 7 includes the IC board 52, the IC element 2 mounted on the IC board, and the cooling module 3 attached to the IC element 2.

Further, the circuit board 7 includes the heat spreader 51 located between the IC element 2 and the cooling module 3, and the motherboard 53 on which the IC board 52 and the heat spreader are mounted. Accordingly, the cooling performance of the cooling module is able to be further significantly improved. Specifically, the heat of the IC element 2 is able to be efficiently conducted by the heat spreader 51, and the cooling efficiency is able to be significantly improved.

In the circuit board 7, the motherboard 53 includes the power supply 18a including the input terminal and the output terminal, the input terminal of the power supply 18a is electrically connected to the first electrode terminal 19a of the cooling module 3, and the output terminal of the power supply 18a is electrically connected to the second electrode terminal 19b of the cooling module 3. Accordingly, the cooling module 3 is able to be driven by the power supply 18a of the motherboard 53.

In the circuit board 7, the cooling module 3 is provided on the heat spreader 51, and a portion of the cooling module 3 that is not in contact with the heat spreader 51 is attached to the motherboard 53. Accordingly, the cooling module 3 is able to be attached to the motherboard 53 while the cooling module 3 is in contact with the heat spreader 51. As a result, attachment of the cooling module 3 becomes easy.

In the first preferred embodiment, an example has been described in which the first electrode 13 and the second electrode 14 include a porous conductive material, but the present invention is not limited to this. The first electrode 13 and the second electrode 14 are not limited to the porous material, and may include a non-porous material. Accordingly, for example, the first electrode 13 and the second electrode 14 may include a plurality of through holes extending in the fluid flow direction A1.

In the first preferred embodiment, an example has been described in which the dielectric layer 15 is formed by the plurality of spheres 16, but the present invention is not limited to this. The dielectric layer 15 may include a plurality of microchannels 17 having a dimension in which an electroosmotic flow occurs. Accordingly, for example, the plurality of microchannels 17 may be a plurality of through holes extending in the fluid flow direction A1.

In the first preferred embodiment, the example has been described in which the dielectric layer 15 includes the plurality of microchannels 17. However, the present invention is not limited to this. The dielectric layer 15 may have at least one microchannel 17.

In the first preferred embodiment, an example has been described in which the circuit board 7 includes the IC element 2, the cooling module 3, the heat spreader 51, the IC board 52, and the motherboard 53, but the present invention is not limited to this. For example, the circuit board 7 may not include the heat spreader 51 and/or the motherboard 53. Alternatively, the circuit board 7 may include the plurality of IC elements 2, the plurality of cooling modules 3, and the plurality of IC boards 52.

In the first preferred embodiment, the example has been described in which the first electrode 13 and the second electrode 14 are formed by cutting the flat porous body 30 into an L-shape, but the present invention is not limited to this. The first electrode 13 and the second electrode 14 are able to be formed by various arbitrary methods. For example, the first electrode 13 and the second electrode 14 may be formed by a 3D printer.

In the first preferred embodiment, an example has been described in which, in the cooling system 1, the IC element 2 and the cooling module 3 are components of the circuit board 7, and the heat exchanger 4, the fan 5, and the pipe 6 are not components of the circuit board 7. However, the present invention is not limited to this. The heat exchanger 4, the fan 5, and/or the pipe 6 may be components of the circuit board 7. That is, the heat exchanger 4, the fan 5, and/or the pipe 6 may be included in the circuit board 7.

Second Preferred Embodiment

A cooling module according to a second preferred embodiment of the present invention will be described. In the second preferred embodiment, points different from the first preferred embodiment will be mainly described. In the second preferred embodiment, the same or equivalent components as those in the first preferred embodiment are denoted by the same reference numerals and described. Further, in the second preferred embodiment, description overlapping with the first preferred embodiment will be omitted.

Figure 9:
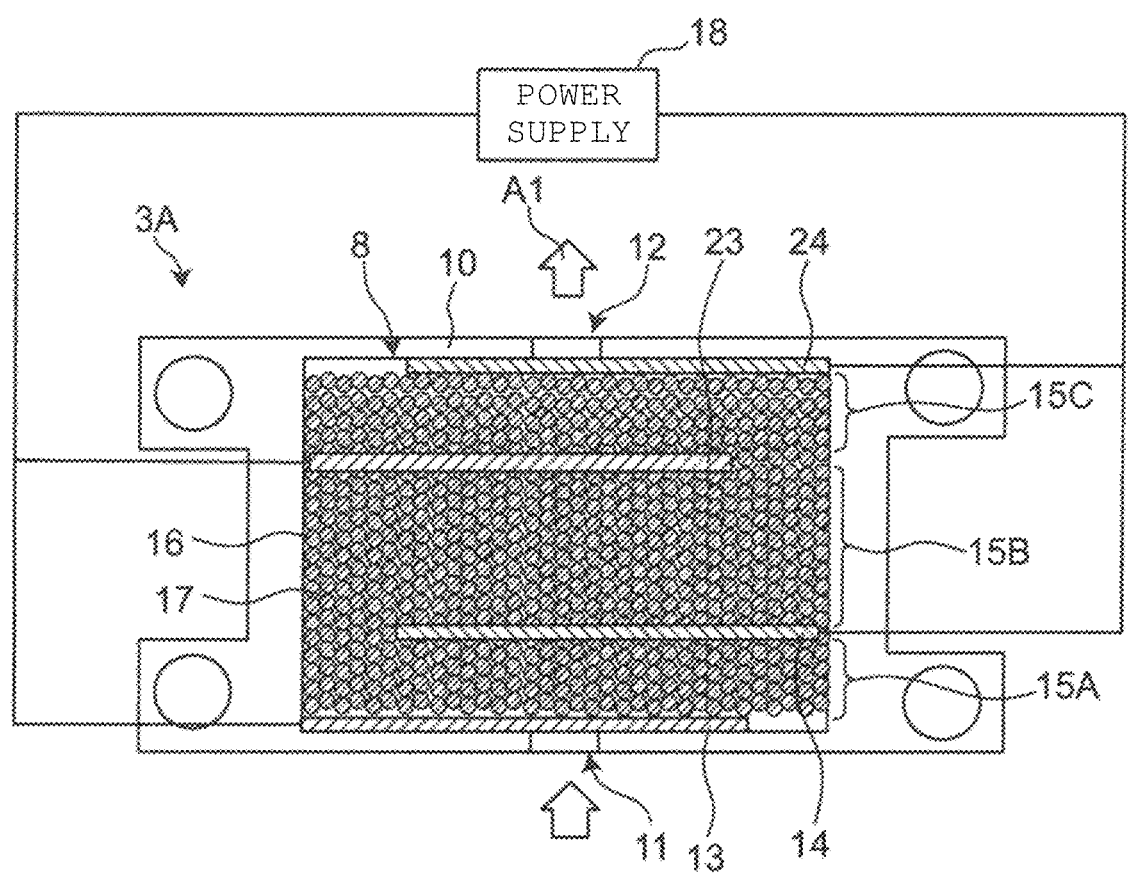
FIG. 9 is a diagram of one example of a cooling module according to a second preferred embodiment of the present invention in plan view.
Figure 10:
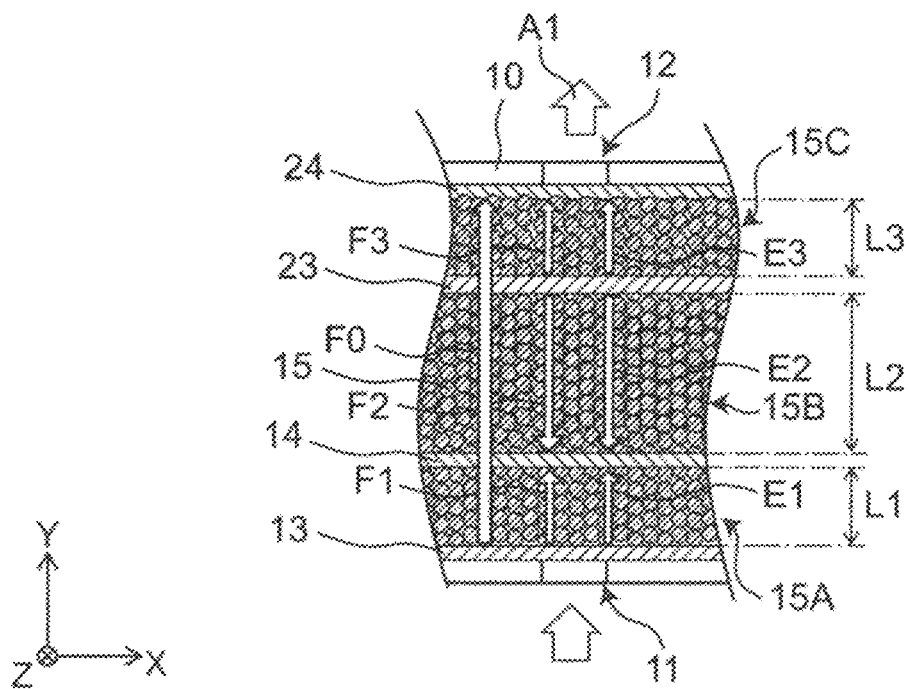
FIG. 10 is a view showing a principle of the cooling module according to the second preferred embodiment of the present invention.

An example of the cooling module according to the second preferred embodiment will be described with reference to FIGS. 9 and 10. FIG. 9 is a diagram of one example of a cooling module 3A according to the second preferred embodiment of the present invention in plan view. FIG. 10 is a view showing a principle of the cooling module according 3A to the second preferred embodiment of the present invention.

The second preferred embodiment is different from the first preferred embodiment in that cooling module 3A includes four electrodes 13, 14, 23, and 24 and three dielectric layers 15A, 15B, and 15C.

As shown in FIGS. 9 and 10, the cooling module 3A includes the third electrode 23 and the fourth electrode 24 in addition to the first electrode 13 and the second electrode 14. The third electrode 23 is located at an interval from the second electrode 14. The fourth electrode 24 is located at an interval from the third electrode 23. Inside the exterior body 10, the four electrodes are provided in the order of the first electrode 13, the second electrode 14, the third electrode 23, and the fourth electrode 24 from the upstream side to the downstream side. The third electrode 23 faces the second electrode 14 with an interval. The fourth electrode 24 faces the third electrode 23 with an interval.

The first electrode 13 and the third electrode 23 are electrically connected to the input terminal of the power supply 18. The second electrode 14 and the fourth electrode 24 are electrically connected to the output terminal of the power supply 18. Accordingly, the polarities of the first electrode 13 and the third electrode 23 are different from the polarities of the second electrode 14 and the fourth electrode 24. In the second preferred embodiment, the first electrode 13 and the third electrode 23 define and function as anodes, and the second electrode 14 and the fourth electrode 24 define and function as cathodes.

The third electrode 23 and the fourth electrode 24 have the same or similar features as the first electrode 13 and the second electrode 14 of the first preferred embodiment. That is, the third electrode 23 and the fourth electrode 24 include a porous conductive material which is permeable to a fluid. In the second preferred embodiment, the third electrode 23 and the fourth electrode 24 are flat or substantially flat metal meshes having two facing main surfaces. The main surfaces of the third electrode and the fourth electrode 24 are provided in a direction intersecting with the fluid flow direction A1.

In the cooling module 3A, the first dielectric layer 15A is located between the first electrode 13 and the second electrode 14. The second dielectric layer 15B is located between the second electrode 14 and the third electrode 23. The third dielectric layer 15C is located between the third electrode 23 and the fourth electrode 24. In other words, inside the exterior body 10 of the cooling module 3A, the first electrode 13, the first dielectric layer 15A, the second electrode 14, the second dielectric layer 15B, the third electrode 23, the third dielectric layer 15C, and the fourth electrode 24 are stacked in this order from the upstream side where the fluid flows to the downstream side.

Each of the dielectric layers 15A, 15B, and 15C has the same or similar features as the dielectric layer 15 of the first preferred embodiment. That is, each of the dielectric layers 15A, 15B, and 15C is formed by the plurality of spheres 16 that define the plurality of microchannels 17.

As shown in FIG. 10, in the cooling module 3A, the thickness L1 of the first dielectric layer 15A and the thickness L3 of the third dielectric layer 15C are smaller than the thickness L2 of the second dielectric layer 15B. That is, the thickness relationship of L1<L2 and L3<L2 is established.

A voltage is applied between the first electrode 13 and the second electrode 14 by the power supply 18 in a state where the fluid exists inside the cooling module 3. As a result, an electric field E1 is generated from the first electrode 13 toward the second electrode 14. An electric field E2 is generated from the third electrode 23 toward the second electrode 14. An electric field E3 is generated from the third electrode 23 toward the fourth electrode 24.

When the electric fields E1 to E3 are generated, a driving force is generated in the fluid existing in the microchannel 17 provided inside the dielectric layer 15A. Here, the driving force between the first electrode 13 and the second electrode 14 is set as F1, the driving force between the second electrode 14 and the third electrode 23 is set as F2, and the driving force between the third electrode 23 and the fourth electrode 24 is set as F3. Assuming that the fluid flow direction A is the positive direction of the driving force, the driving force F1 and the driving force F3 have positive values, and the driving force F2 has a negative value. The respective magnitudes of the driving forces F1 to F3 are proportional to the intensities of the electric fields E1 to E3 between the corresponding electrodes, and the respective intensities of the electric fields E1 to E3 are inversely proportional to the thicknesses L1, L2, and L3 of the dielectric layers 15A, 15B, and 15C.

In the second preferred embodiment, the thicknesses L1, L2, and L3 of the dielectric layers 15A, 15B, and 15C satisfy the relationship of L1<L2 and L3<L2. Therefore, the intensity of the electric fields, that is, the electric field E1 and the electric field E3 in the fluid flow direction A1 are able to be greater than the intensity of the electric field, that is, the electric field E2 in the direction opposite to the fluid flow direction A1. Therefore, the magnitudes of the driving forces F1 to F3 satisfy the relationship of F1>F2 and F2<F3. Therefore, the driving force F0 (=F1+F2+F3) acting on the fluid has a positive value, and the fluid flows in the direction of arrow A. That is, the fluid flow direction A1 is determined by the direction of the driving force F0 acting on the fluid.

Advantageous Effects

According to the cooling module 3A according to the second preferred embodiment, the following advantageous effects are able to be provided.

In the cooling module 3A, the first electrode 13, the second electrode 14, the third electrode 23, and the fourth electrode 24 which is permeable to a fluid are provided from the upstream side to the downstream side. The polarities of the first electrode 13 and the third electrode 23 are different from the polarities of the second electrode 14 and the fourth electrode 24. The first dielectric layer 15A is located between the first electrode 13 and the second electrode 14. The second dielectric layer 15B is located between the second electrode 14 and the third electrode 23. The third dielectric layer 15C is located between the third electrode 23 and the fourth electrode 24. Each of the first dielectric layer 15A, the second dielectric layer 15B, and the third dielectric layer 15C is provided with the microchannel 17. As described above, the driving force that sends the fluid is able to be increased by including the plurality of electrodes and the plurality of dielectric layers. Thereby, the flow rate of the fluid sent from the cooling module 3A is able to be increased.

The thicknesses L1 and L3 of the first dielectric layer 15A and the third dielectric layer 15C are smaller than the thickness L2 of the second dielectric layer 15B. Accordingly, the driving force of the electroosmotic pump 8 that sends the fluid is able to be increased. Thereby, the flow rate is able to be further increased.

In the second preferred embodiment, an example has been described in which the cooling module 3A includes four electrodes and three dielectric layers, but the present invention is not limited to this. The cooling module 3A may include four or more electrodes and three or more dielectric layers. Accordingly, a dielectric may be provided between the electrodes, and the polarities of the adjacent electrodes may be different from each other. Even with such features, the flow rate of the fluid that is able to be sent from the cooling module 3A may be increased.

In the second preferred embodiment, an example has been described in which the thicknesses L1 and L3 of the first dielectric layer 15A and the third dielectric layer 15C are smaller than the thickness L2 of the second dielectric layer 15B, but the preferred embodiments of the present invention are not limited to this. The thicknesses L1, L2, and L3 of the first dielectric layer 15A, the second dielectric layer 15B, and the third dielectric layer 15C may be equal or substantially equal. Even with such a features, the driving force F0 (=F1+F2+F3) acting on the fluid has a positive value, and the fluid is able to flow in the flow direction A1.

Third Preferred Embodiment

A circuit board according to a third preferred embodiment of the present invention will be described. In the third preferred embodiment, points different from the first preferred embodiment will be mainly described. In the third preferred embodiment, the same or equivalent components as those in the first preferred embodiment are denoted by the same reference numerals and described. Further, in the third preferred embodiment, description overlapping with the first preferred embodiment will be omitted.

Figure 11:
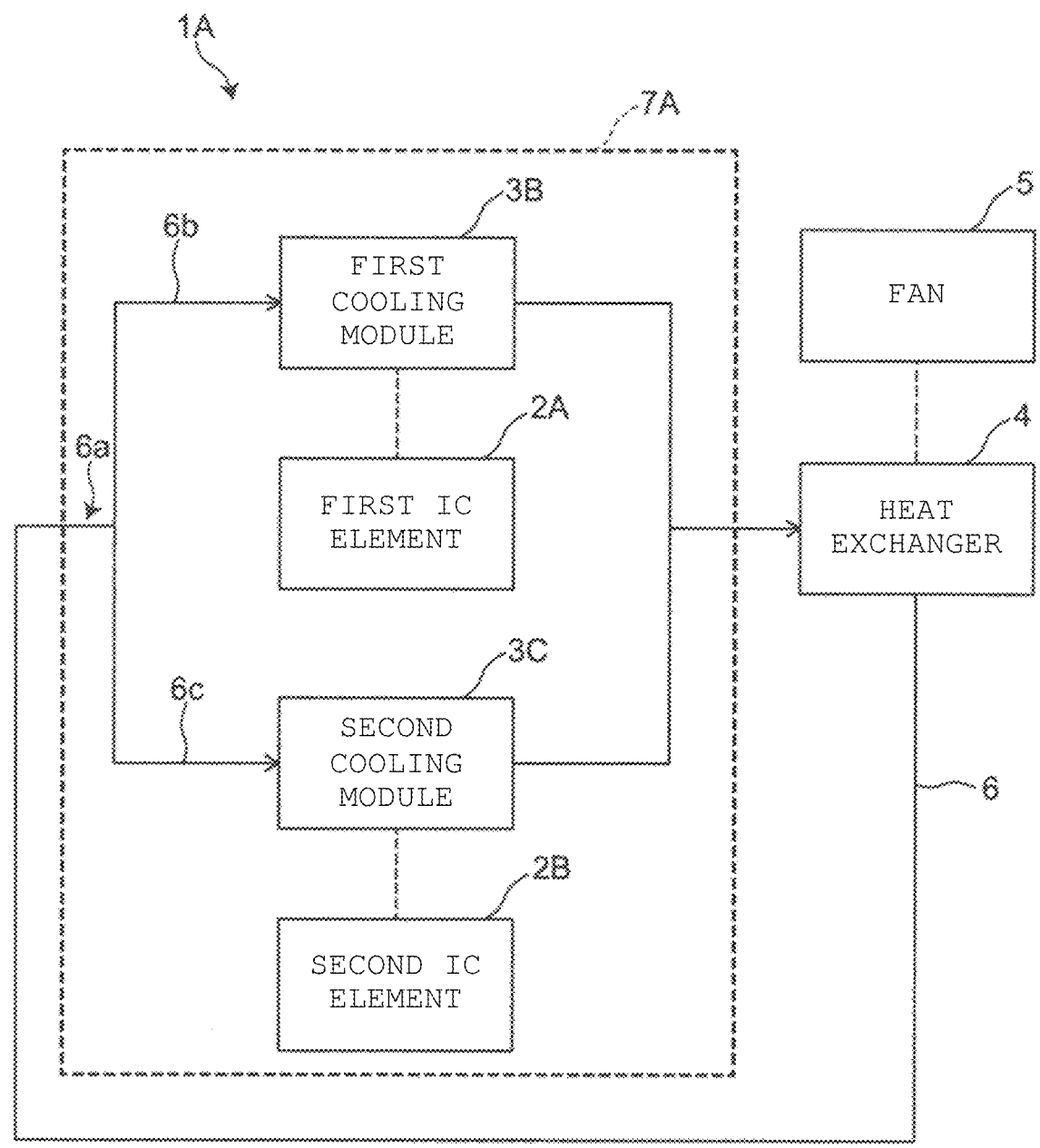
FIG. 11 is a block diagram of a cooling system including one example of a circuit board according to a third preferred embodiment of the present invention.

An example of the circuit board according to the third preferred embodiment will be described with reference to FIG. 11. FIG. 11 is a block diagram of a cooling system 1A including one example of a circuit board 7A according to the third preferred embodiment of the present invention.

The third preferred embodiment is different from the first preferred embodiment in that cooling modules 3B and 3C connected in parallel by a pipe 6a are provided.

As shown in FIG. 11, the cooling system 1A includes the circuit board 7A, the heat exchanger 4, the fan 5, and the pipe 6.

The circuit board 7A includes the first cooling module 3B, the second cooling module 3C, a first IC element 2A, a second IC element 2B, and the pipe 6a.

The first cooling module 3B and the second cooling module 3C have the same or similar features as the cooling module 3 of the first preferred embodiment.

The first IC element 2A and the second IC element 2B correspond to the IC element 2 of the first preferred embodiment. For example, the first IC element 2A is a CPU, and the second IC element 2B is a GPU.

The circuit board 7A includes the heat spreader 51, the IC board 52, and the motherboard 53 as in the first preferred embodiment.

The first cooling module 3B contacts the first IC element 2A with the heat spreader 51 provided therebetween. Thereby, the first IC element 2A is cooled by the fluid flowing in the first cooling module 3B.

The second cooling module 3C contacts the second IC element 2B with the heat spreader 51 provided therebetween. Thus, the second IC element 2B is cooled by the fluid flowing in the second cooling module 3C.

The first cooling module 3B and the second cooling module 3C are connected in parallel by the pipe 6a. The pipe 6a is connected to the pipe 6.

The pipe 6a is divided into two flow paths before being connected to the first cooling module 3B and the second cooling module 3C. That is, the pipe 6a branches into a first branch flow path 6b and a second branch flow path 6c upstream of the first cooling module 3B and the second cooling module 3C. The first branch flow path 6b is connected to the first cooling module 3B. The second branch flow path 6c is connected to the second cooling module 3C. Then, the first branch flow path 6b and the second branch flow path 6c merge downstream of the first cooling module 3B and the second cooling module 3C.

As described above, the first cooling module 3B and the second cooling module 3C are connected in parallel by the pipe 6a, and the fluid is supplied to each of the first cooling module 3B and the second cooling module 3C.

Advantageous Effects

According to the circuit board 7A according to the third preferred embodiment, the following advantageous effects are able to be provided.

The circuit board 7A includes the pipe 6a that connects the first cooling module 3B and the second cooling module 3C in parallel and supplies a fluid to each of the first cooling module 3B and the second cooling module 3C. Accordingly, the two IC elements are able to be cooled, and the flow rate of the fluid may be increased to significantly improve the cooling performance. Also, even when cooling two IC elements, the fluid is able to be sent by the first cooling module 3B and the second cooling module 3C without including a pump as a separate component. Thereby, the cooling system 1A is able to be significantly reduced in size and thickness.

In the third preferred embodiment, an example has been described in which the circuit board 7A includes two cooling modules and two IC elements, but the present invention is not limited to this. The circuit board 7A may include two or more cooling modules and a plurality of IC elements. Accordingly, when the circuit board 7A includes a plurality of cooling modules, the plurality of cooling modules may be connected in parallel by the pipe 6a. Further, the circuit board 7A may include two or more heat spreaders 51.

The cooling module and the circuit board of the present invention is able to be applied to, for example, a cooling system of an IC element.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A cooling module comprising:
    an inlet including a first opening;
    an outlet including a second opening; and
    an electroosmotic pump; wherein
    the electroosmotic pump includes:
        a first electrode which is permeable to a cooling fluid;
        a second electrode located at an interval from the first electrode and is permeable to the fluid; and
        a dielectric layer located between the first electrode and the second electrode and including a microchannel which is permeable to the fluid;
    the first opening and the second opening face each other in a direction in which the first electrode and the second electrode face each other; and
    the first electrode and the second electrode have different polarities.

2. The cooling module according to claim 1, wherein the dielectric layer includes a plurality of spheres; and the microchannel is a void defined between the plurality of spheres.

3. The cooling module according to claim 1, further comprising:
    an exterior body in which the electroosmotic pump is disposed; wherein
    the exterior body includes:
        a housing including an opening; and
        a lid that closes the opening of the housing;
    the housing includes a first side wall, a second side wall facing the first side wall, and a connection portion which faces the lid and connects the first side wall and the second side wall;
    the first electrode, the second electrode, and the dielectric layer are stacked and provided in a direction from the first side wall toward the second side wall of the housing;
    on a first side wall of the housing positioned on the first electrode side, the inlet through which the fluid flows is provided in a direction in which the first electrode, the second electrode, and the dielectric layers are stacked; and
    on a second side wall of the housing positioned on the second electrode side, the outlet through which the fluid flows is provided in the direction in which the first electrode, the second electrode, and the dielectric layers are stacked.

4. The cooling module according to claim 3, wherein the connection portion is provided with a first electrode terminal connected to the first electrode and a second electrode terminal connected to the second electrode.

5. The cooling module according to claim 4, wherein the first electrode and the second electrode face each other with the dielectric layer interposed between the first electrode and the second electrode.

6. The cooling module according to claim 3, wherein the lid includes a plurality of recesses on a surface that contacts the dielectric layer; and the plurality of recesses have a shape along the shape of the dielectric layer.

7. The cooling module according to claim 1, wherein the dielectric layer defines a first dielectric layer;
the electroosmotic pump further includes:
   a third electrode located at an interval from the second electrode and is permeable to the fluid;
   a fourth electrode located at an interval from the third electrode and is permeable to the fluid;
   a second dielectric layer located between the second electrode and the third electrode and including a microchannel; and
   a third dielectric layer located between the third electrode and the fourth electrode and includes a microchannel; and
polarities of the first electrode and the third electrode are different from polarities of the second electrode and the fourth electrode.

8. The cooling module according to claim 7, wherein a thickness of the first dielectric layer and a thickness of the third dielectric layer are smaller than a thickness of the second dielectric layer.

9. A circuit board comprising:
one or more IC boards;
one or more IC elements mounted on the one or more IC boards; and
one or more cooling modules according to claim 1 attached to the IC elements.

10. The circuit board according to claim 9, further comprising:
   one or more heat spreaders which are located between the one or more IC elements and the one or more cooling modules; and
   a motherboard on which the one or more IC boards and the one or more heat spreaders are mounted.

11. The circuit board according to claim 10, wherein
the motherboard includes a power supply including an input terminal and an output terminal;
the input terminal of the power supply is electrically connected to a first electrode terminal of the one or more cooling modules; and
the output terminal of the power supply is electrically connected to a second electrode terminal of the one or more cooling modules.

12. The circuit board according to claim 10, wherein
the one or more cooling modules are provided on the one or more heat spreaders; and
a portion of the one or more cooling modules that is not in contact with the one or more heat spreaders is attached to the motherboard.

13. The circuit board according to claim 9, further comprising:
   a pipe connecting the one or more cooling modules in parallel.

14. The cooling module according to claim 3, wherein the fluid flow in through the inlet, passes through an interior of the exterior body, and is discharged through the outlet.

15. The cooling module according to claim 3, wherein the exterior body is made of an insulating material.

16. The cooling module according to claim 1, wherein each of the first electrode and the second electrode is defined by a flat or substantially flat metal mesh.

17. The cooling module according to claim 1, wherein the dielectric layer is made of a porous ceramic.

18. The cooling module according to claim 3, wherein the lid includes a plurality of recesses that each has a hemispherical or substantially hemispherical shape.

19. A cooling module comprising:
an electroosmotic pump; and
an exterior body in which the electroosmotic pump is disposed; wherein
the electroosmotic pump includes:
   a first electrode which is permeable to a cooling fluid;
   a second electrode located at an interval from the first electrode and is permeable to the fluid; and
   a dielectric layer located between the first electrode and the second electrode and including a microchannel which is permeable to the fluid;
the first electrode and the second electrode have different polarities;
the exterior body includes:
   a housing including an opening; and
   a lid that closes the opening of the housing;
the lid includes a plurality of recesses on a surface that contacts the dielectric layer; and
the plurality of recesses have a shape that extends along and corresponds to the shape of the dielectric layer.

20. A cooling module comprising:
an electroosmotic pump; and
an exterior body in which the electroosmotic pump is disposed; wherein
the electroosmotic pump includes:
   a first electrode which is permeable to a cooling fluid;
   a second electrode located at an interval from the first electrode and is permeable to the fluid; and
   a dielectric layer located between the first electrode and the second electrode and including a microchannel which is permeable to the fluid;
the first electrode and the second electrode have different polarities;
the exterior body includes:
   a housing including an opening; and
   a lid that closes the opening of the housing;
the housing includes a first side wall, a second side wall facing the first side wall, and a connection portion which faces the lid and connects the first side wall and the second side wall;
the first electrode, the second electrode, and the dielectric layer are stacked and provided in a direction from the first side wall toward the second side wall of the housing;
on a first side wall of the housing positioned on the first electrode side, an inlet through which the fluid flows is provided in a direction in which the first electrode, the second electrode, and the dielectric layers are stacked; and
on a second side wall of the housing positioned on the second electrode side, an outlet through which the fluid flows is provided in the direction in which the first electrode, the second electrode, and the dielectric layers are stacked.

* * * * *